United States Patent
Noyes et al.

(10) Patent No.: US 11,217,373 B2
(45) Date of Patent: *Jan. 4, 2022

(54) FREQUENCY LOSS INDUCED QUENCH PROTECTION SYSTEM FOR HIGH TEMPERATURE SUPERCONDUCTORS AND ASSOCIATED METHOD OF USE

(71) Applicant: The Florida State University Research Foundation, Inc., Tallahassee, FL (US)

(72) Inventors: Patrick D. Noyes, Tallahassee, FL (US); Kikelomo Ijagbemi, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/725,268

(22) Filed: Dec. 23, 2019

(65) Prior Publication Data

US 2020/0251266 A1 Aug. 6, 2020

Related U.S. Application Data

(63) Continuation of application No. 16/167,068, filed on Oct. 22, 2018, now Pat. No. 10,515,749.
(Continued)

(51) Int. Cl.
*H01F 6/04* (2006.01)
*H01F 6/02* (2006.01)
(Continued)

(52) U.S. Cl.
CPC ............... *H01F 6/02* (2013.01); *H01F 6/06* (2013.01); *H02H 7/001* (2013.01);
(Continued)

(58) Field of Classification Search
CPC ..... H01F 6/04; H01F 6/02; H01F 6/06; H01F 7/00; H01F 7/001; H01F 9/023; G01R 33/3815; Y02E 40/68; Y02E 40/69
(Continued)

(56) References Cited

U.S. PATENT DOCUMENTS

| 4,996,472 A | 2/1991 | Mallick, Jr. |
| 6,600,618 B2 | 7/2003 | Schlager |

(Continued)

FOREIGN PATENT DOCUMENTS

| EP | 1923709 B1 | 5/2012 |
| WO | 2014052686 A2 | 4/2014 |

OTHER PUBLICATIONS

Ravaioli. CLIQ. A new quench protection technology for superconducting magnets PhD. thesis. Enschede: Universiteit Twente. 2015: 1-225.
(Continued)

*Primary Examiner* — Danny Nguyen
(74) *Attorney, Agent, or Firm* — Eversheds Sutherland (US) LLP

(57) ABSTRACT

A protection system capable of safely quenching a high temperature superconductor (HTS) magnet coil. The protection circuit provides for a frequency loss induced quench design that advances the protection technology for HTS magnet coils and provides a protection system that is capable of quickly distributing the heat energy uniformly in all the coil sections when a localized hot-spot is created.

18 Claims, 6 Drawing Sheets

Related U.S. Application Data

(60) Provisional application No. 62/575,168, filed on Oct. 20, 2017.

(51) Int. Cl.
  H01F 6/06 (2006.01)
  H02H 7/00 (2006.01)
  G01R 33/3815 (2006.01)
  H02H 9/02 (2006.01)

(52) U.S. Cl.
  CPC ............ *G01R 33/3815* (2013.01); *H01F 6/04* (2013.01); *H02H 9/023* (2013.01); *Y02E 40/60* (2013.01)

(58) Field of Classification Search
  USPC .......................................................... 361/19
  See application file for complete search history.

(56) References Cited

U.S. PATENT DOCUMENTS

| | | | |
|---|---|---|---|
| 6,747,418 B2 | 6/2004 | Sowa | |
| 10,515,749 B2* | 12/2019 | Noyes | H02H 7/001 |
| 2008/0055026 A1 | 3/2008 | Frank et al. | |
| 2011/0068789 A1* | 3/2011 | Hwang | G01R 33/3804 324/307 |
| 2012/0014030 A1 | 1/2012 | Ichiki et al. | |
| 2013/0184159 A1* | 7/2013 | Forsyth | H01F 6/008 505/163 |
| 2016/0156174 A1 | 6/2016 | Kirby et al. | |

OTHER PUBLICATIONS

Transient Suppression Devices and Voltage Clamping. Basic Electronics Tutorials. 2017. [Online]. Data Accessed: Jan. 18, 2019. https://www.electronics-tutorials.ws/power/transient-suppresion.html.

Current Transducer HTFS 200.. 800-P/SP2. LEM 2014. Version 8: 1-4. https://www.lem.com/sites/default/files/products_datasheets/htfs_200_800-p_sp2.pdf.

Hybrid Circuits Optimize Gate Drive and Protect High Power IGBT Modules. Power Electronics. [Online]. Date Accessed: Jan. 8, 2019: 1-11. https://www.powerelectronics.com/print/12499.

International Search Report and Written Opinion for PCT/US18/56856 (filing date: Oct. 22, 2018) dated Jan. 15, 2019; Applicant: The Florida State University Research Foundation, Inc.

* cited by examiner

FREQUENCY LOSS INDUCED QUENCH PROTECTION SYSTEM FOR HIGH TEMPERATURE SUPERCONDUCTORS AND ASSOCIATED METHOD OF USE

CROSS-REFERENCE TO RELATED APPLICATIONS

This application is a continuation application of U.S. patent application Ser. No. 16/167,068, filed on Oct. 22, 2018, which claims priority to U.S. Provisional Patent Application No. 62/575,168, filed on Oct. 20, 2017 and entitled "Frequency Loss Induced Quench Protection System for High Temperature Superconductors and Associated Method of Use," the entire contents of each are incorporated herein by reference in their entirety for all purposes.

GOVERNMENT SUPPORT STATEMENT

This invention was made with Government support under Grant No. 227000-520-030759 awarded by the National Science Foundation. The Government has certain rights in the invention.

FIELD OF INVENTION

This invention relates generally to high temperature superconducting (HTS) magnets and particularly to quench protection of HTS magnets.

BACKGROUND OF THE INVENTION

High temperature conducting (HTS) magnets, such as HTS magnets formed from rare earth barium copper oxide (REBCO) bismuth strontium calcium copper oxide (BSCCO), yttrium barium copper oxide (YBCO) and magnesium diboride ($MgB_2$), are designed to produce high magnetic fields to store large amounts of magnetic energy during operation. However, the stored energy in the HTS magnet may subject the magnet to a failure mechanism referred to as a "quench", in which the stored energy is suddenly converted into heat accompanied by the presence of large electrical voltages. A quench typically occurs in an HTS magnet when a conductor transitions from the superconducting state to the normal state is some region of one of the magnet coils. In the normal state, the non-superconducting region of the conductor exhibits an increasingly large electrical resistance, relative to the super-conducting state, resulting in excessive heating of the magnet. The excess temperature and voltage in the windings of the HTS magnet cause by a quench condition can potentially damage the magnet.

In the event of a quench condition in a large superconducting magnet, the current in the superconducting magnet must be rapidly reduced to prevent damage to the magnet resulting from a peak hot-spot temperature or from a mechanical strain. Any method to reduce the magnet current by altering the magnet current through external means, such as a resistor, would involve large voltages, which is undesirable. Alternatively, by warming a large portion of the superconductor to above critical temperature (Tc), the resulting resistance may be distributed throughout the superconducting device, which can dramatically reduce the peak voltages experienced by a quenching coil.

It is known in the art to integrate a set of embedded heaters into the magnet windings to warm the superconductor, thereby distributing the thermal energy throughout the magnet. Additionally, a method is known in the art which relies on AC coupling, commonly referred to as Coupling Loss induced Quench (CLIQ). In CLIQ, the magnetic energy is distributed by driving an imbalance in the transport current between two or more sections of the magnet. While these known techniques are adequate for low temperature superconducting magnets, they provide marginal quench protection for recently developed high temperature superconductors and are not effective in rapidly distributing a large amount of thermal energy to the windings of an HTS magnet. Additionally, in CLIQ based quench protection systems, to increase the available energy, either the capacitance of the system must be increased, which slows down the frequency, or the voltage must be increased, which results in safety concerns.

Protection of HTS magnets for reliable operation has proven to be a challenge, particularly in Rare Earth Barium Copper Oxide (REBCO) superconductors, due to the large amount of energy that is required to get enough of the current into the metallic stabilizer to properly distribute the magnetic energy and to minimize peak hot-spot temperatures during a quench condition.

Accordingly, what is needed in the art is an improved quench protection system for high temperature superconductors (HTS).

SUMMARY OF INVENTION

In various embodiments, the present invention provides an improved quench protection system for high temperature superconducting (HTS) magnet coils.

In one embodiment, the present invention provides a method for controlling a quench in a high temperature superconductor (HTS) magnet coil which includes, coupling a current imbalance source to at least one coil subsection of an HTS magnet coil, wherein the HTS magnet coil comprises a plurality of coil subsections, and operating the current imbalance source to induce a current imbalance in the at least one coil subsection of the HTS magnet coil to establish a high frequency change in a magnetic field of the HTS magnet coil resulting in inductive heating of the HTS magnet coil to control a quench in the HTS magnet coil.

In various embodiments, the current imbalance source of the present invention may be external to the HTS magnet coil or internal to the HTS magnet coil and the method may be applied to HTS magnet coils having insulated conductors and uninsulated conductors.

In one embodiment, the current imbalance source may include an alternating current (AC) voltage source and a capacitive element coupled in series with the AC voltage source, wherein the AC voltage source and the capacitive element are coupled across the at least one coil subsection of the HTS magnet coil.

In another embodiment, the current imbalance source may include a high impedance device, a capacitive element coupled in series with the high impedance device and a switch coupled across the high impedance device and the capacitive element, wherein the high impedance device, the capacitive element and the switch are coupled across the at least one coil subsection of the HTS magnet coil.

In another embodiment, the current imbalance source may include an alternating current (AC) voltage source, a capacitive element coupled in series with the AC voltage source and a coil element, wherein the AC voltage source and the capacitive element are inductively coupled to the at least one coil subsection of the HTS magnet coil through the coil element.

The present invention further provides a system for controlling a quench in a high temperature superconductor (HTS) magnet coil. The quench protection system may include a current imbalance source coupled to at least one coil subsection of an HTS magnet coil, wherein the HTS magnet coil comprises a plurality of coil subsections and quench actuation circuitry for operating the current imbalance source to induce a current imbalance in the at least one coil subsection of the HTS magnet coil to establish high frequency change in a magnetic field of the HTS magnet coil resulting in inductive heating of the HTS magnet coil to control a quench in the HTS magnet coil.

The quench protection system may further include a quench detection circuitry for detecting a quench condition in the HTS magnet coil prior to operating the current imbalance source. In a particular embodiment, the quench detection circuitry may include a non-contact current sensing transducer.

Accordingly, the present invention provides an improved system and method for controlling a quench condition in an HTS magnet coil.

BRIEF DESCRIPTION OF THE DRAWINGS

For a fuller understanding of the invention, reference should be made to the following detailed description, taken in connection with the accompanying drawings, in which.

DETAILED DESCRIPTION OF THE INVENTION

The key to quench protection is to prevent the degradation of the HTS coil by limiting localized temperature growth. In various embodiments, the present invention provides a protection system capable of safely quenching an HTS coil. The protection circuit design of the present invention advances the protection technology for HTS magnet coils and is capable of quickly distributing the heat energy uniformly in all the coil sections when a localized hot-spot is formed.

In accordance with the present invention, by placing a current imbalance source on a subsection of the HTS coil, a high frequency imbalance current can be driven into the coil subsection, whereby the alternating imbalance current drives a high frequency change in the magnetic field of the HTS coil, thereby depositing thermal energy into the conductor of the HTS coil through several mechanisms. Through the proper placement of one or more capacitors, the coil subsections that are not currently connected to the voltage source will be exposed to the same rapid change in the magnetic field, but 180° out of phase. A current measurement device, that can measure the imbalance current, controls the switch and the state of the imbalance voltage inducing the current imbalance changes when the imbalance current approaches zero.

Figure 1:
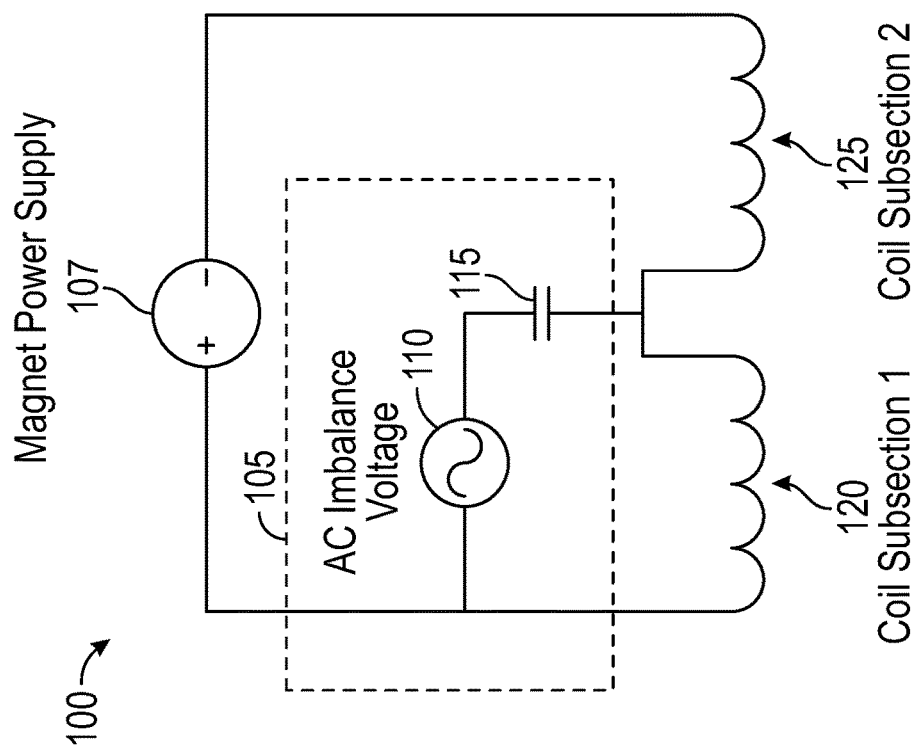
FIG. 1 is schematic diagram of a high-level circuit for connecting an alternating current (AC) imbalance source and a capacitor to a high temperature superconducting (HTS) magnet having an insulated conductor, in accordance with an embodiment of the present invention.

In one embodiment, the source of the current imbalance may be external. As shown in FIG. 1, a system for providing quench protection in an HTS coil 100 includes an external current imbalance source 105 which includes an alternating current (AC) voltage source 110 in series with a capacitive element 115. The HTS magnet comprises of a plurality of coil subsections 120, 125 and includes a magnet power supply 107 coupled across the plurality of coil subsections 120, 125. The current imbalance source 105 of the present invention is positioned across a first coil subsection 120 of the HTS coil. In operation, when a quench is detected in one of the subsections of the HTS coil, the current imbalance source 105 is actuated to induce a current imbalance in the first coil subsection 120 of the HTS magnet coil, thereby establishing a high frequency change in a magnetic field of the HTS magnet coil which results in inductive heating of the HTS magnet coil subsections 120, 125 to control the quench in the HTS magnet coil.

Figure 2:
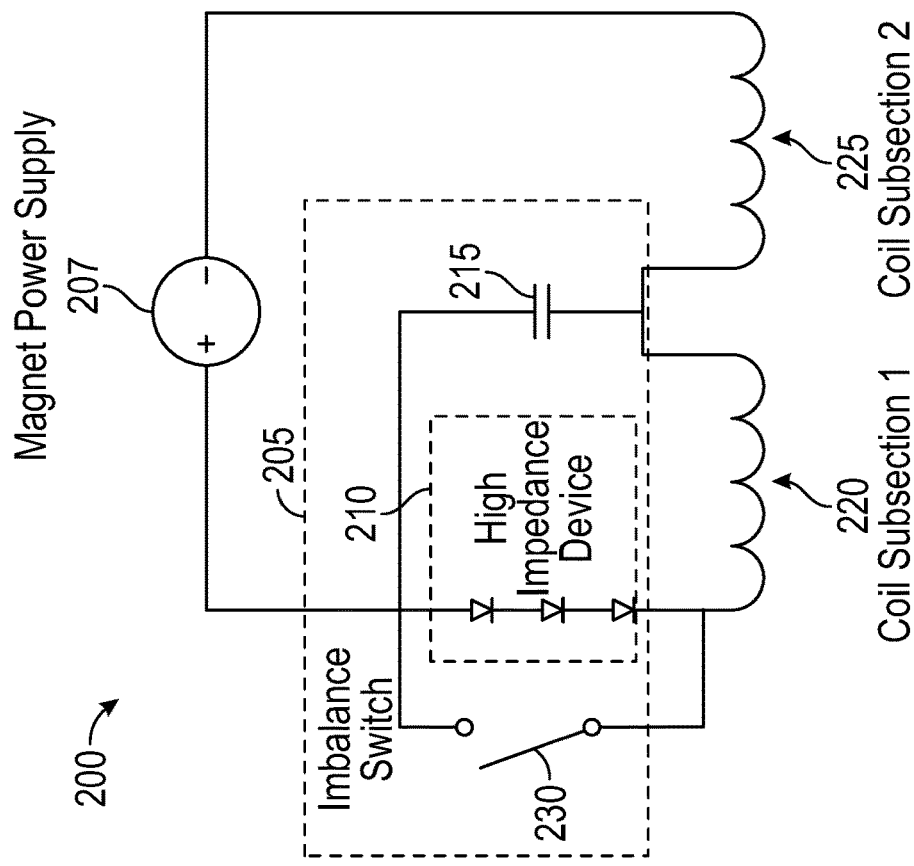
FIG. 2 is a schematic diagram of a high-level circuit utilizing an internally stored energy to drive an imbalance current in an HTS magnet having an insulated conductor, in accordance with an embodiment of the present invention.

In another embodiment, as shown in FIG. 2, a system for providing quench protection in an HTS coil 200 includes an internal current imbalance source 205 which includes a high impedance device 210 in series with a capacitive element 215 and an imbalance switch 230 across the high impedance device 210. The HTS magnet comprises of a plurality of coil subsections 220, 225 and includes a magnet power supply 207 coupled across the plurality of coil subsections 220, 225. In this embodiment, the source of the current imbalance is provided by placing the high impedance device 210 on one of the leads of the HTS magnet and rapidly running the transport current through the high impedance device 210 or by a rapidly switching short using the imbalance switch 230. In operation, when a quench is detected in one of the subsections of the HTS coil, the current imbalance source 205 is actuated to induce a current imbalance in the first coil subsection 220 of the HTS magnet coil, thereby establishing a high frequency change in a magnetic field of the HTS magnet coil which results in inductive heating of the HTS magnet coil subsections 220, 225 to control the quench in the HTS magnet coil. In this embodiment, the high impedance device 210 comprising a plurality of diodes in series, however this is not intended to be limiting and our means for providing a high impedance device are within the scope of the present invention.

In the embodiment illustrated in FIG. 1 and FIG. 2, the conductor of the HTS coils are wound with insulation, thereby allowing the capacitor to resonate in series with the capacitive element. Due to internal shorting, HTS coils that are not wound with insulation cannot resonate in series with a capacitor.

Figure 3:
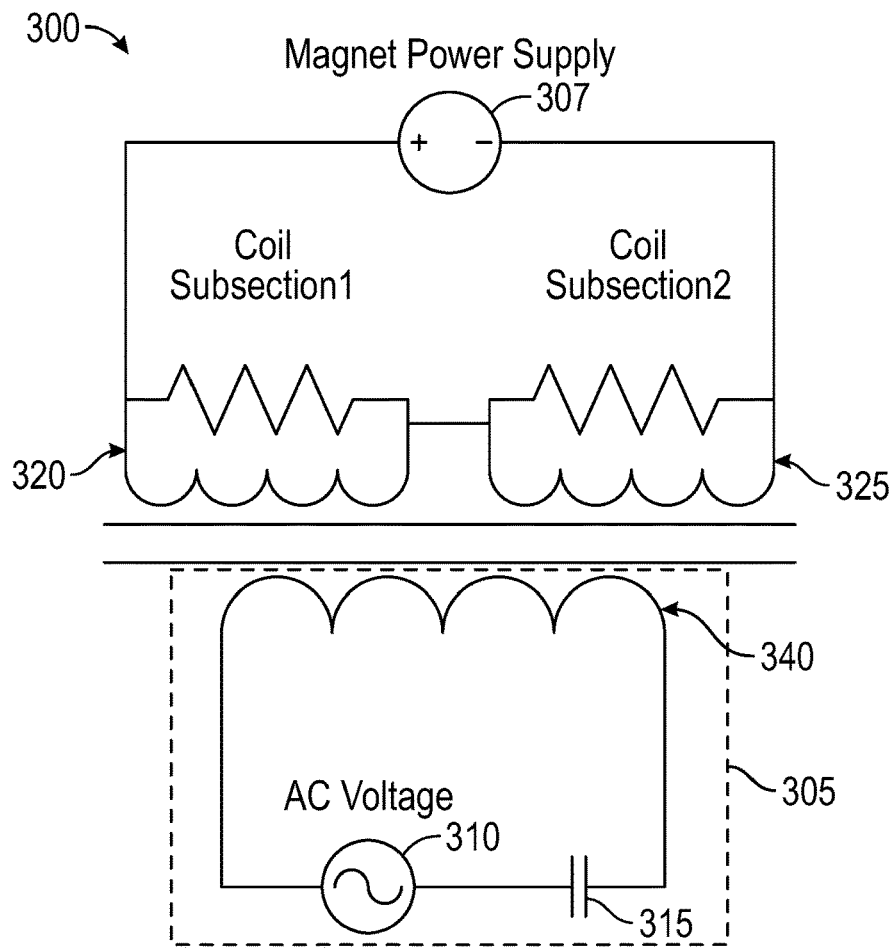
FIG. 3 is a schematic diagram of a high-level circuit for coupling an external coil to an HTS magnet having an uninsulated conductor, in accordance with an embodiment of the present invention.

However, as shown in the embodiment of FIG. 3, by inductively coupling an external pulse coil 340 to the HTS magnet subsections 320, 325, large amounts of thermal energy can be deposited directly into the windings (coil subsections) 320, 325 of the HTS magnet to provide a quench protection system 300. The HTS magnet comprises of a plurality of coil subsections 320, 325 and includes a magnet power supply 307 coupled across the plurality of coil subsections 320, 325. In this embodiment, the imbalance current source 305 includes an AC voltage source 310 in series with a capacitive element 315 that is coupled across an external pulse coil 340. In operation, when a quench is detected in one of the subsections of the HTS coil, the current imbalance source 305 is actuated to inductively induce a current imbalance in the coil subsections 320, 325 of the HTS magnet coil through the external pulse coil 340, thereby establishing a high frequency change in a magnetic field of the HTS magnet coil which results in inductive heating of the HTS magnet coil subsections 320, 325 to control the quench in the HTS magnet coil.

In general, the present invention provides a quench protection system implementing a Frequency Loss Induced Quench (FLIQ) which relies on AC losses to distribute the magnetic energy in the HTS magnet and to minimize peak hot-spot temperatures in the HTS magnet coil during a quench condition.

The FLIQ system of the present invention utilizes the heat generated by AC losses in the high temperature superconductor magnet windings, which is deliberately achieved by applying electrical current oscillating at the frequency of the load. The FLIQ system uses induction heating methods, which change the local current distribution and magnetic fields in the HTS magnet coil. Based on Faraday's law, changes in current induce voltages caused by the created magnetic field. The change in magnetic field results in both eddy currents and magnetization losses in the HTS magnet, which increases the temperature of the superconductor. With eddy current losses, the deposited thermal energy decreases, as penetration depth increases, due to the fact that the induced currents do not have an ohmic loss component in the superconductor, assuming the currents do not exceed the local critical current, $I_c$. The penetration depth is dependent upon the resistance of the metallic stabilizer on the superconductor and the frequency. A higher frequency is desirable for the quench protection system and penetration depth of the induced currents is given by:

$$\delta = \sqrt{(1/\omega\mu\sigma)} \quad (1)$$

Where, $\omega=2\pi$, $\sigma$=conductivity, $\mu$=magnetic permeability and f=frequency.

In a specific embodiment of the quench protection system of the present invention, the design characteristics of the FLIQ system include a remote trigger using transistor-transistor logic (TTL), adjustable activation time, adjustable frequency, zero-crossing capability, current feedback control and self-oscillation.

In an exemplary hardware design of the system, the FLIQ device consists of different sections that support the generation of AC loss in the HTS magnet coil. In one embodiment, FLIQ device includes four Insulated Gate Bipolar Transistors (IGBTs) connected in an H-bridge circuit and a driving circuit. A capacitor is also connected at the center of the H-bridge circuit, in series with the HTS coil. The H-bridge mechanism was chosen because it allows the flow of current in two directions and supports the zero switching capability which generates the signal used to control to the gate driver input. Switching of the H-bridge generates the energy needed to quench the superconducting coil. The FLIQ system optimizes frequency, as a result of the current resonating at the frequency of the inductive/capacitive (LC) network across the H-bridge.

Figure 4:
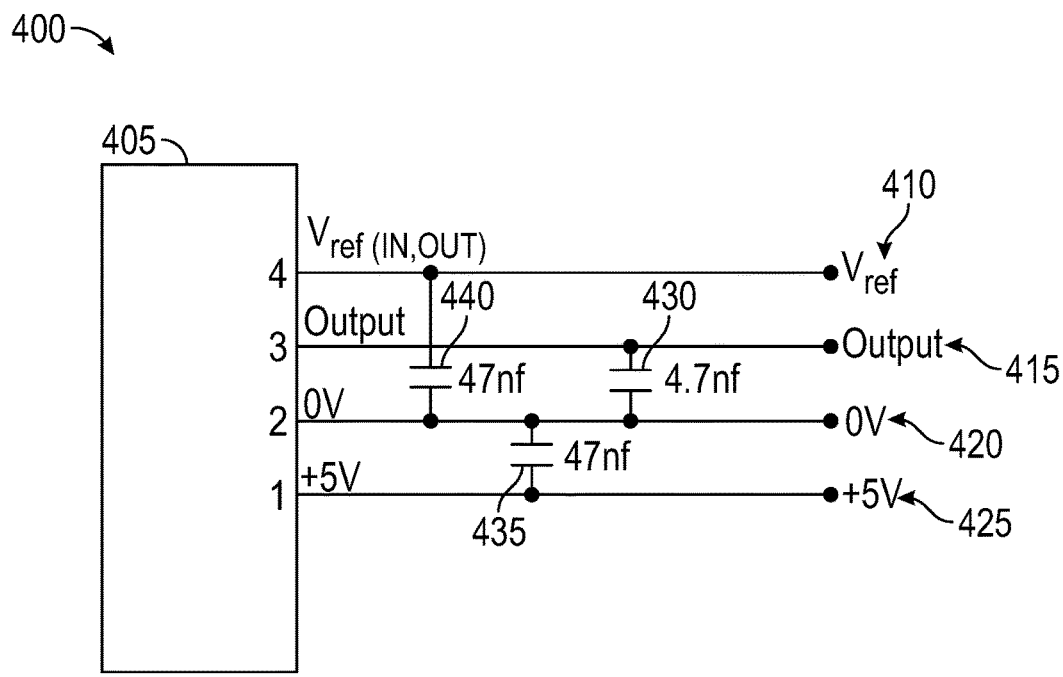
FIG. 4 is a schematic diagram of quench detection circuitry, in accordance with an embodiment of the present invention.

The system and method for quench protection includes circuitry 400 that further detects a quench condition in the HTS coil. As shown in FIG. 4, in one embodiment, quench detection circuitry may include a non-contact current sensing transducer 405 that uses the Hall Effect measuring principle to measure the current across the load. This circuitry may be effective over a sensing range between −1200 A to +1200 A, which further improves the reliability of the FLIQ system due to its wide measurement range.

In various embodiments, the current transducer 405 is powered between 0V ground 420 and +5 V supply 425.

Capacitors 430, 435, 440 are connected across the input and output terminals of the current sensor to further filter unregulated signals. The output voltage 415 and the reference voltage 410 are supplied to a comparator (not shown). The comparator compares the output voltage 415 of the current sensor to the reference voltage 410 and produces an output that serves as the input signal to the gate drivers. A diode may be connected to the output of the comparator in order to prevent backward flow of current or high voltage surges from other components to the comparator and invariably protect the current sensor as well.

Figure 5:
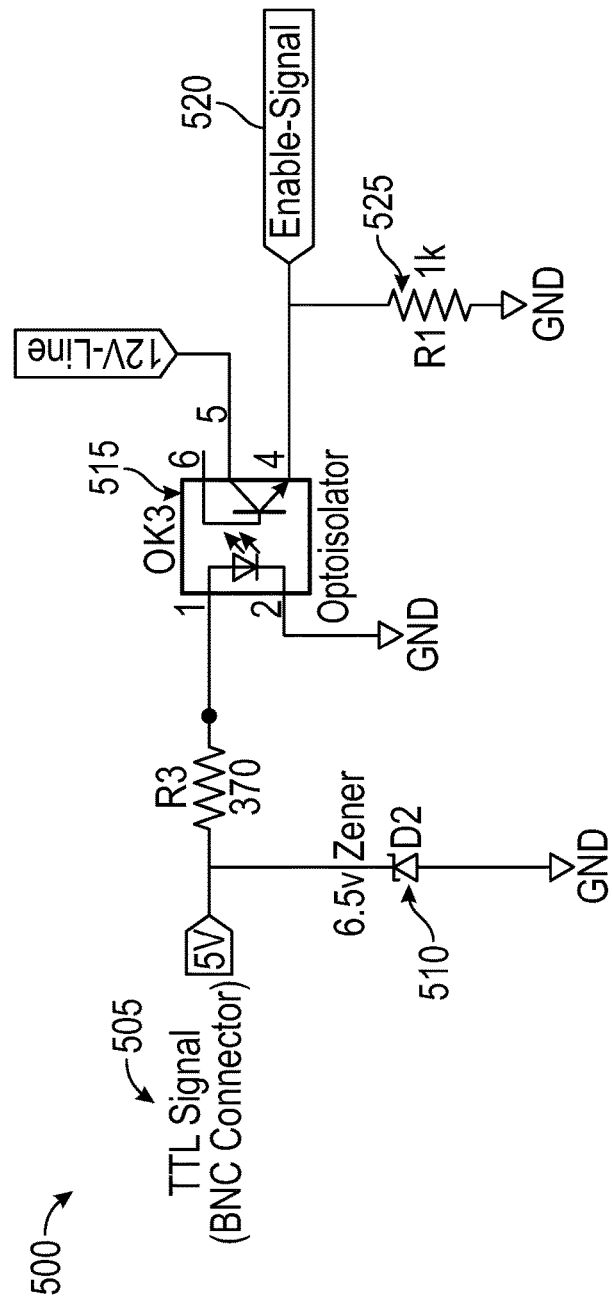
FIG. 5 is a schematic diagram of quench actuation control circuitry, in accordance with an embodiment of the present invention.

The quench protection system further comprises quench actuation circuitry 500 to provide actuation of the FLIQ system via a remote Transistor-Transistor Logic (TTL) signal 505, as shown in FIG. 5. The pulse 505 has a maximum output threshold to determine when the signal is high and a minimum output threshold level to determine when the signal is low. The 6.5 V Zener diode 510 acts as a transient suppressor in case an overvoltage is supplied. The Zener 510 swings into a breakdown mode of operation and instantly clamps the overvoltage to a safe level to limit the voltage to ≤5 V signal. An optoisolator 515 is connected between the supplied TTL signal 505 and an enable signal 520 to the gate driver. The optoisolator 515 protects and electrically isolate the supplied voltage from the rest of the circuit in case an unregulated high voltage transient is supplied. The 1 kΩ resistor 525 connected across the enable signal 520 makes the system active only when the enable signal 520 is high because the enable input of the gate driver has a 100 kΩ resistor drawn to $V_{DD}$ (voltage supply).

Figure 6:
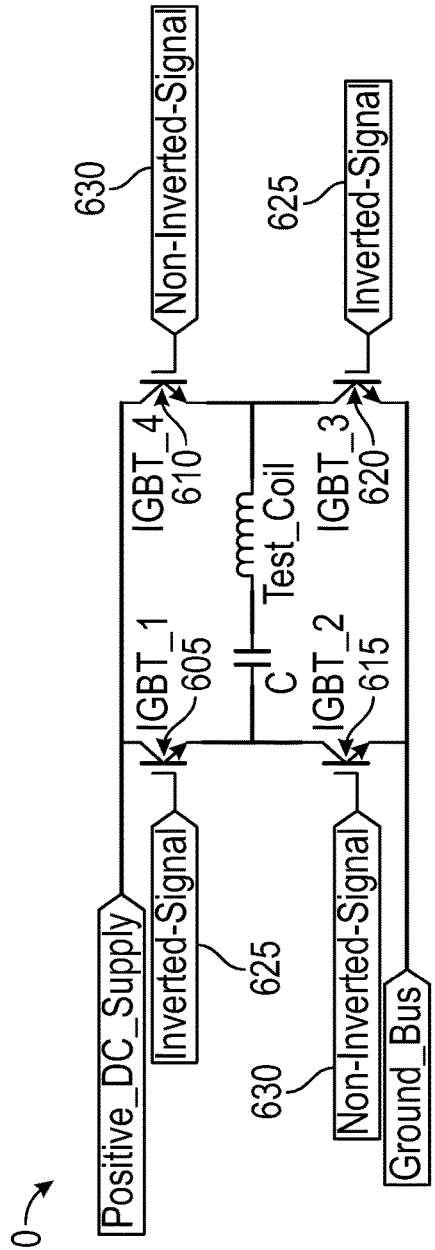
FIG. 6 is schematic diagram of an H-bridge circuit for providing the high frequency and high current power to drive the HTS coil, in accordance with an embodiment of the present invention.

In a particular embodiment, the quench protection system of the present invention further comprises an H-bridge circuit 600 for providing the high frequency and high current power needed to drive the superconducting coil, as shown in FIG. 6. The H-bridge 600 can be divided into two-half sections, the top half of the bridge has two IGBTs labelled IGBT 1 605 and IGBT 4 610 and the bottom half of the bridge has IGBT 2 615 and IGBT 3 620. In the H-bridge circuit 600, current flows in two directions across the bridge. IGBT 1 605 and IGBT 3 620 are controlled with the inverting gate driver 625 and IGBT 2 615 and IGBT 4 620 are controlled with the non-inverting gate driver 630. This is to ensure that only two adjacent IGBTs are powered at the same time, as voltage is applied in two directions. Based on FIG. 6, none of the top IGBTs 605, 610 or the bottom IGBTs 615, 620 should be powered at the same, otherwise the entire system will be shorted.

The gate drivers 625, 630 are integrated circuits that has an enable input that is supplied from the remote TTL signal and the input signal is supplied from the comparator output, which is a function of the current sensed across the superconducting magnet and capacitor.

TABLE 1

Gate Driver Logic

|  | ENABLE | INPUT | OUTPUT |
|---|---|---|---|
| INVERTING DRIVER | 0 | 0 | 0 |
|  | 0 | 1 | 0 |
|  | 1 | 0 | 1 |
|  | 1 | 1 | 0 |
| NON-INVERTING DRIVER | 0 | 0 | 0 |
|  | 0 | 1 | 0 |
|  | 1 | 0 | 0 |
|  | 1 | 1 | 1 |

The output of the gate drivers supplies the gate-emitter voltage ($V_{GE}$) needed to control which of the IGBTs 605, 610, 615, 620 are operating at any given time. The primary function of the gate drive circuit is to convert logic level control signals into the appropriate voltage and current for efficient, reliable, switching of the IGBT module. The $V_{GE}$ for IGBT 1 605 and IGBT 4 610 is supplied through an optocoupler, thereby creating a voltage difference or floating potential to the gate and emitter terminal of the top two IGBTs 605, 610.

The output of the H-bridge 600 is coupled to the HTS coil 635 and the frequency of the load is based on the equation:

$$f = 1/\sqrt{2\pi LC} \qquad (2)$$

An exemplary embodiment of the quench protection system 700 of the present invention includes a REBCO (42-62) coil in liquid Nitrogen at a temperature of 77 K. As shown in the block diagram in FIG. 7, the superconducting coil 705 and a capacitor 710 are connected in series across the centre of the H-bridge 715. In this exemplary embodiment, a fuse 720 limits the supplied current to its current rating. When testing the FLIQ system for the first time, a dump resistor (Rdump) 725 was used to act as a preventive protection method to further ensure the safe quenching of the coil 705. The dump resistor 725 is connected across the LC load to redirect current in a fault condition. In this exemplary embodiment, the system 700 was operated at a frequency of 50 Hz produced by an external signal generator. In this embodiment, a DC current is supplied to the load via the two switches 735, 740 with a 2 Ohms resistor 745 connected across the DC current supply 730 to sense the imbalance. The sense resistor 750 is used to measure the FLIQ current across the H-bridge 715. In this embodiment, when quench is detected, the direction of current flow across the H-bridge 715 generates the imbalance in the transport current of the coil 705, thereby safely controlling the quench in the coil 705.

Figure 7:
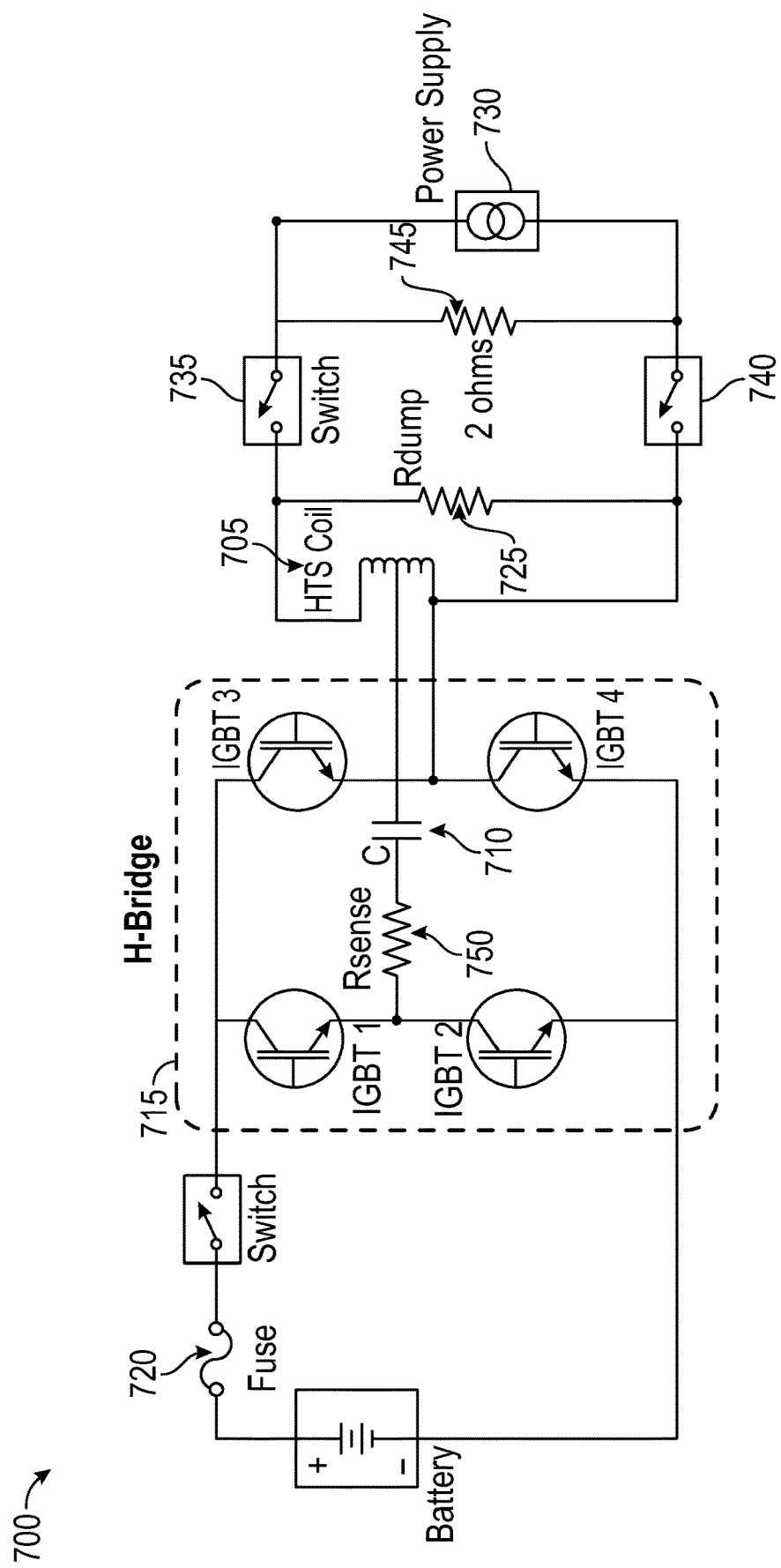
FIG. 7 is a schematic diagram of an exemplary embodiment of the quench protection system, in accordance with an embodiment of the present invention.
Figure 8:
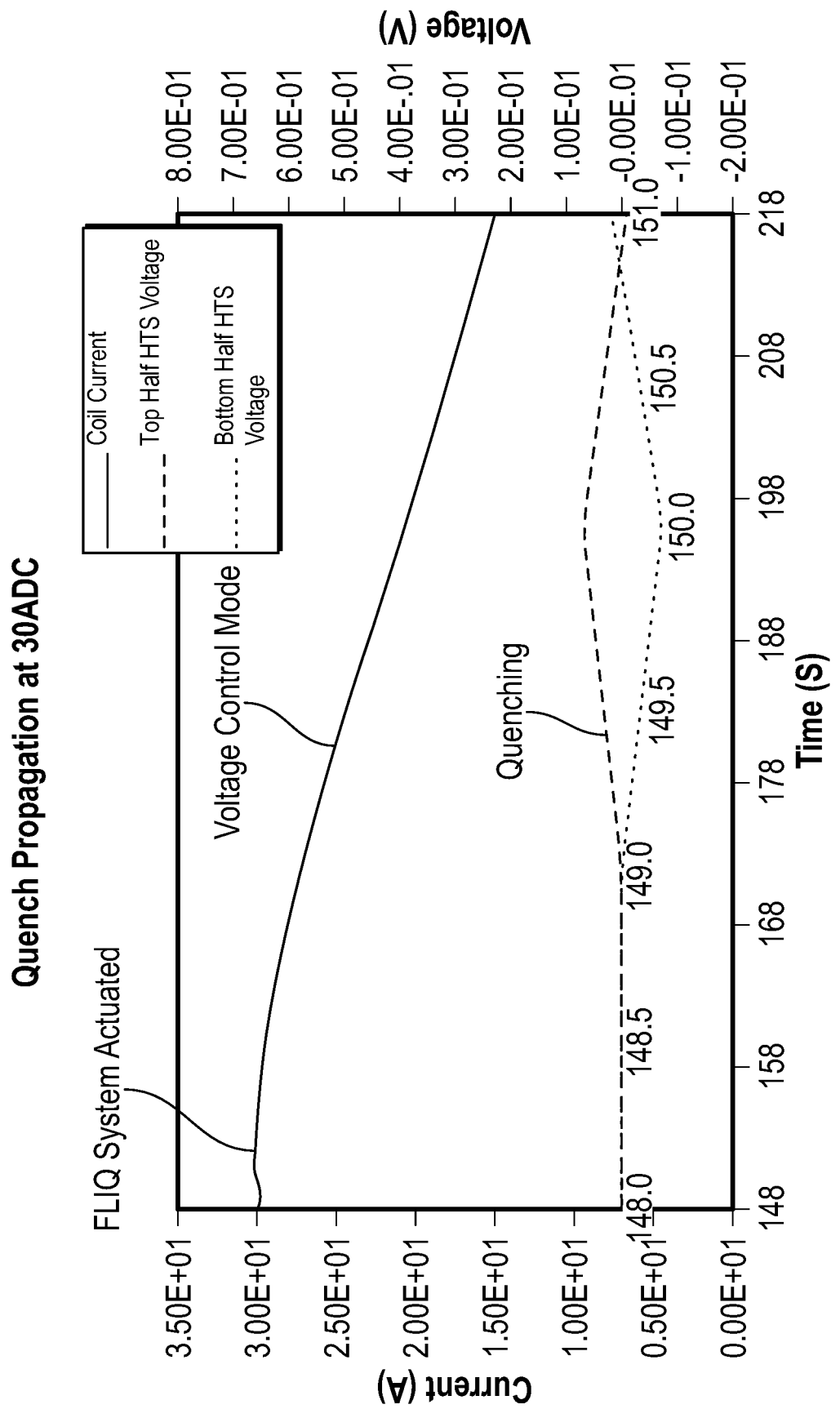
FIG. 8 is a graphical illustration of the quench propagation within the HTS coil in an exemplary embodiment of the quench protection system, in accordance with an embodiment of the present invention.
Figure 9:
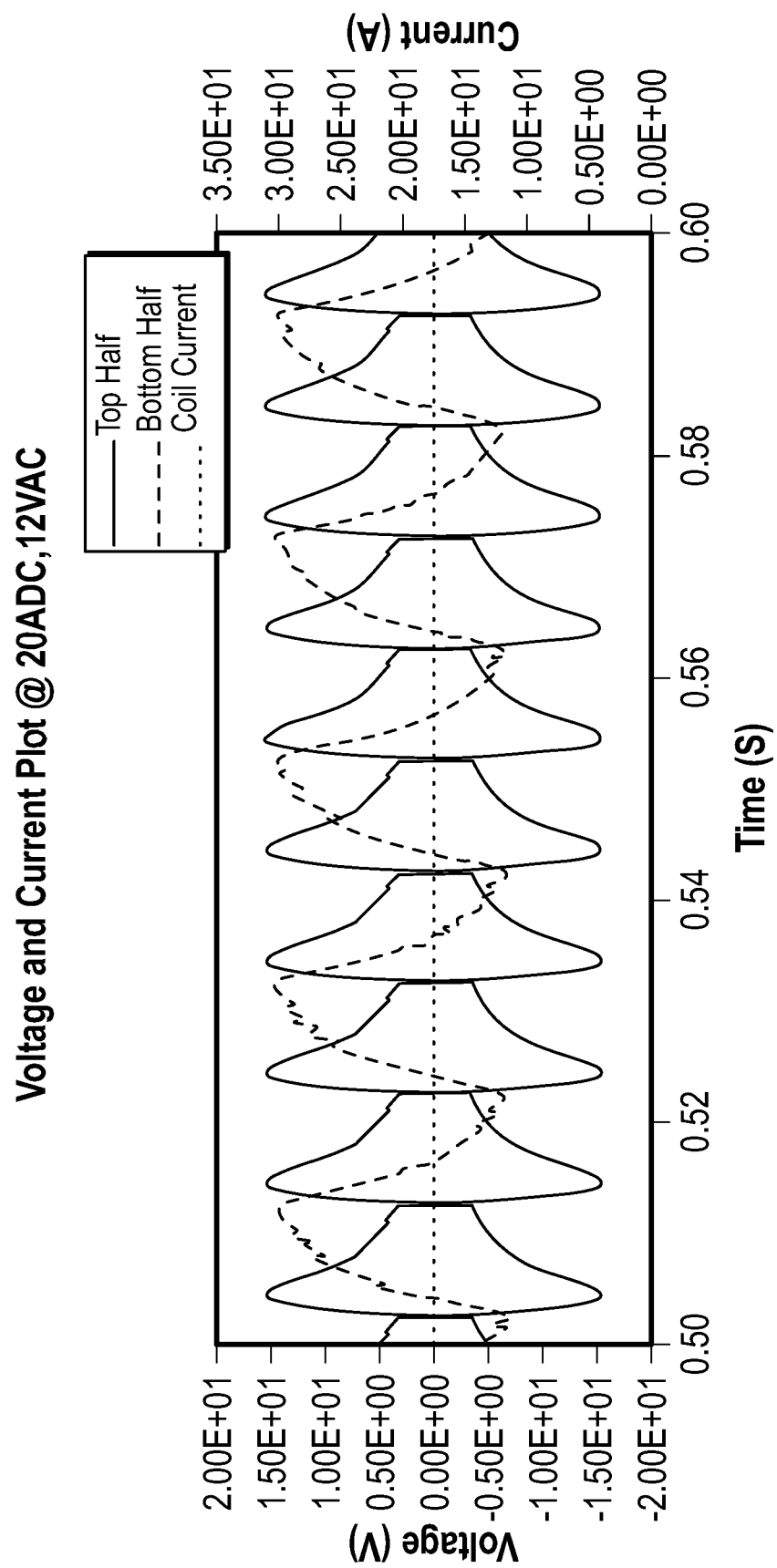
FIG. 9 is a graphical illustration of the voltage and current plot of the HTS coil in an exemplary embodiment of the quench protection system, in accordance with an embodiment of the present invention.

The test results of the exemplary embodiment of FIG. 7 are illustrated in FIG. 8 and in FIG. 9. FIG. 8 illustrates the quench propagation of the HTS coil when the circuit was supplied with 12 VAC, 20 ADC at a temperature of 77 K. The graph in FIG. 9 shows that the voltage across the HTS coil oscillates at the frequency of the current and that the voltage across the top half and the bottom half of the coil are opposite to each other.

In various embodiments, the present invention provides a protection system capable of safely quenching an HTS coil. The protection circuit design advances the protection technology for high temperature superconducting magnet coils and provides a protection system that is capable of quickly distributing the heat energy uniformly in all the coil sections when a localized hot-spot forms. The experimental validation of the performance of the circuit demonstrates that the circuit causes a safe quench in a model coil.

The present invention may be embodied on various computing platforms that perform actions responsive to software-based instructions. The following provides an antecedent basis for the information technology that may be utilized to enable the invention.

The computer readable medium described in the claims below may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire-line, optical fiber cable, radio frequency, etc., or any suitable combination of the foregoing. Computer program code for carrying out operations for aspects of the present invention may be written in any combination of one or more programming languages, including an object oriented programming language such as Java, C#, C++ or the like and conventional procedural programming languages, such as the "C" programming language or similar programming languages.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween. Now that the invention has been described,

What is claimed:

1. A method for controlling a quench in a high temperature superconductor (HTS) magnet coil, the method comprising:
coupling a current imbalance source to at least one coil subsection of an HTS magnet coil, wherein the HTS magnet coil comprises a plurality of coil subsections, wherein the HTS magnet coil comprises a conductor, wherein the current imbalance source comprises a high impedance device in series with a capacitive element, and wherein the current imbalance source comprises a switch coupled across the high impedance device and the capacitive element, wherein the high impedance device, the capacitive element and the switch are coupled across the at least one coil subsection of the HTS magnet coil; and
operating the current imbalance source to induce a current imbalance in the at least one coil subsection of the HTS magnet coil to control a quench in the HTS magnet coil.

2. The method of claim 1, further comprising detecting a quench condition in the HTS magnet coil prior to operating the current imbalance source.

3. The method of claim 1, wherein the current imbalance source is selected from a current imbalance source external to the HTS magnet coil and a current imbalance source internal to the HTS magnet coil.

4. The method of claim 1, wherein a conductor of the HTS magnet coil is selected from an insulated conductor and an uninsulated conductor.

5. The method of claim 1, wherein operating the current imbalance source to induce a current imbalance in the at least one coil subsection of the HTS magnet coil further comprises establishing a high frequency change in a magnetic field of the HTS magnet coil resulting in inductive heating of the HTS magnet coil.

6. The method of claim 1, wherein the high impedance device comprises an H-bridge circuit.

7. The method of claim 1, wherein the high impedance device and the capacitive element are inductively coupled to the at least one coil subsection of the HTS magnet coil.

8. The method of claim 1, wherein the HTS magnet coil further comprises a direct current (DC) power supply.

9. A method for controlling a quench in a high temperature superconductor (HTS) magnet coil, the method comprising:
coupling a current imbalance source to at least one coil subsection of an HTS magnet coil, wherein the HTS magnet coil comprises a plurality of coil subsections, wherein the HTS magnet coil comprises an uninsulated conductor, and wherein the current imbalance source comprises an alternating current (AC) voltage source in series with a capacitive element, wherein the AC voltage source and the capacitive element are inductively coupled to the at least one coil subsection of the HTS magnet coil; and
operating the current imbalance source to induce a current imbalance in the at least one coil subsection of the HTS magnet coil to control a quench in the HTS magnet coil.

10. A system for controlling a quench in a high temperature superconductor (HTS) magnet coil, the system comprising:
a current imbalance source coupled to at least one coil subsection of an HTS magnet coil, wherein the HTS magnet coil comprises a plurality of coil subsections, wherein the HTS magnet coil comprises a conductor, and wherein the current imbalance source comprises a high impedance device in series with a capacitive element, and wherein the current imbalance source comprises a switch coupled across the high impedance device and the capacitive element, wherein the high impedance device, the capacitive element and the switch are coupled across the at least one coil subsection of the HTS magnet coil; and
quench actuation circuitry for operating the current imbalance source to induce a current imbalance in the at least one coil subsection of the HTS magnet coil to control a quench in the HTS magnet coil.

11. The system of claim 10, further comprising quench detection circuitry for detecting a quench condition in the HTS magnet coil prior to operating the current imbalance source.

12. The system of claim 11, wherein the quench detection circuitry comprises a non-contact current sensing transducer.

13. The system of claim 10, wherein the current imbalance source is selected from a current imbalance source external to the HTS magnet coil and a current imbalance source internal to the HTS magnet coil.

14. The system of claim 10, wherein a conductor of the HTS magnet coil is selected from an insulated conductor and an uninsulated conductor.

15. The system of claim 10, wherein the HTS magnet coil comprises an insulated conductor and wherein the current imbalance source comprises an alternating current (AC) voltage source.

16. The system of claim 10, wherein the high impedance device comprises an H-bridge circuit.

17. The system of claim 10, wherein the HTS magnet coil comprises an uninsulated conductor and where the current imbalance source comprises:
an alternating current (AC) voltage source.

18. The system of claim 10, wherein the HTS magnet coil further comprises a direct current (DC) power supply.

\* \* \* \* \*